(12) United States Patent
Ehlen

(10) Patent No.: US 10,219,413 B1
(45) Date of Patent: Feb. 26, 2019

(54) AIR BLOCKING PANEL ASSEMBLIES FOR COMPONENT RACKS

(71) Applicant: Facebook, Inc., Menlo Park, CA (US)

(72) Inventor: Jon Brian Ehlen, Newark, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/693,304

(22) Filed: Aug. 31, 2017

(51) Int. Cl.
| H05K 7/12 | (2006.01) |
| H05K 7/18 | (2006.01) |
| H05K 5/06 | (2006.01) |
| H05K 7/20 | (2006.01) |
| H05K 7/14 | (2006.01) |

(52) U.S. Cl.
CPC ..... H05K 7/20736 (2013.01); H05K 7/20145 (2013.01); H05K 7/1491 (2013.01)

(58) Field of Classification Search
CPC .......... H05K 7/20736; H05K 7/20145; H05K 7/1491
See application file for complete search history.

(56) References Cited

U.S. PATENT DOCUMENTS

| 5,341,944 | A | * | 8/1994 | Latino | A47B 53/00 211/162 |
| 6,200,170 | B1 | * | 3/2001 | Amberg | G06F 1/181 439/717 |
| 8,327,598 | B2 | * | 12/2012 | Shew | H05K 7/1401 16/225 |
| 2005/0067358 | A1 | * | 3/2005 | Lee | H05K 7/1449 211/26 |
| 2008/0151524 | A1 | * | 6/2008 | Kelly | H04Q 1/064 361/826 |
| 2008/0253076 | A1 | * | 10/2008 | Chen | G06F 1/186 361/679.31 |
| 2011/0228473 | A1 | * | 9/2011 | Anderson | G02B 6/4452 361/679.58 |
| 2011/0299266 | A1 | * | 12/2011 | Barry | G02B 6/3897 361/826 |
| 2014/0078668 | A1 | * | 3/2014 | Goulden | H05K 7/20736 361/679.47 |
| 2016/0113156 | A1 | * | 4/2016 | Varreiter | H05K 7/1492 361/692 |
| 2016/0205812 | A1 | * | 7/2016 | Curtin | H05K 7/20736 361/679.46 |
| 2017/0152969 | A1 | * | 6/2017 | Grandidge | F16L 3/01 |

* cited by examiner

Primary Examiner — Hung S. Bui
Assistant Examiner — Michael A Matey
(74) Attorney, Agent, or Firm — FisherBroyles, LLP

(57) ABSTRACT

Air blocking panel assemblies for server component racks are described herein. An air blocking assembly configured in accordance with the present technology can include a frame portion and a plurality of first engagement features arranged on opposing end regions of the frame portion. The first engagement features are positioned to releasably mate with corresponding second engagement features of the component rack to retain the air blocking panel assembly within the component rack. The air blocking panel assembly can further include a plurality of removable tooling features arranged across a front side of the frame portion. The removable tooling features comprise selectively removable knockout holes that, when removed, are positioned to receive retention members from an external accessory such as a cable tray. The disclosed air blocking panel assemblies are configured for installation and uninstallation with the component rack by hand without the use of any tools.

20 Claims, 5 Drawing Sheets

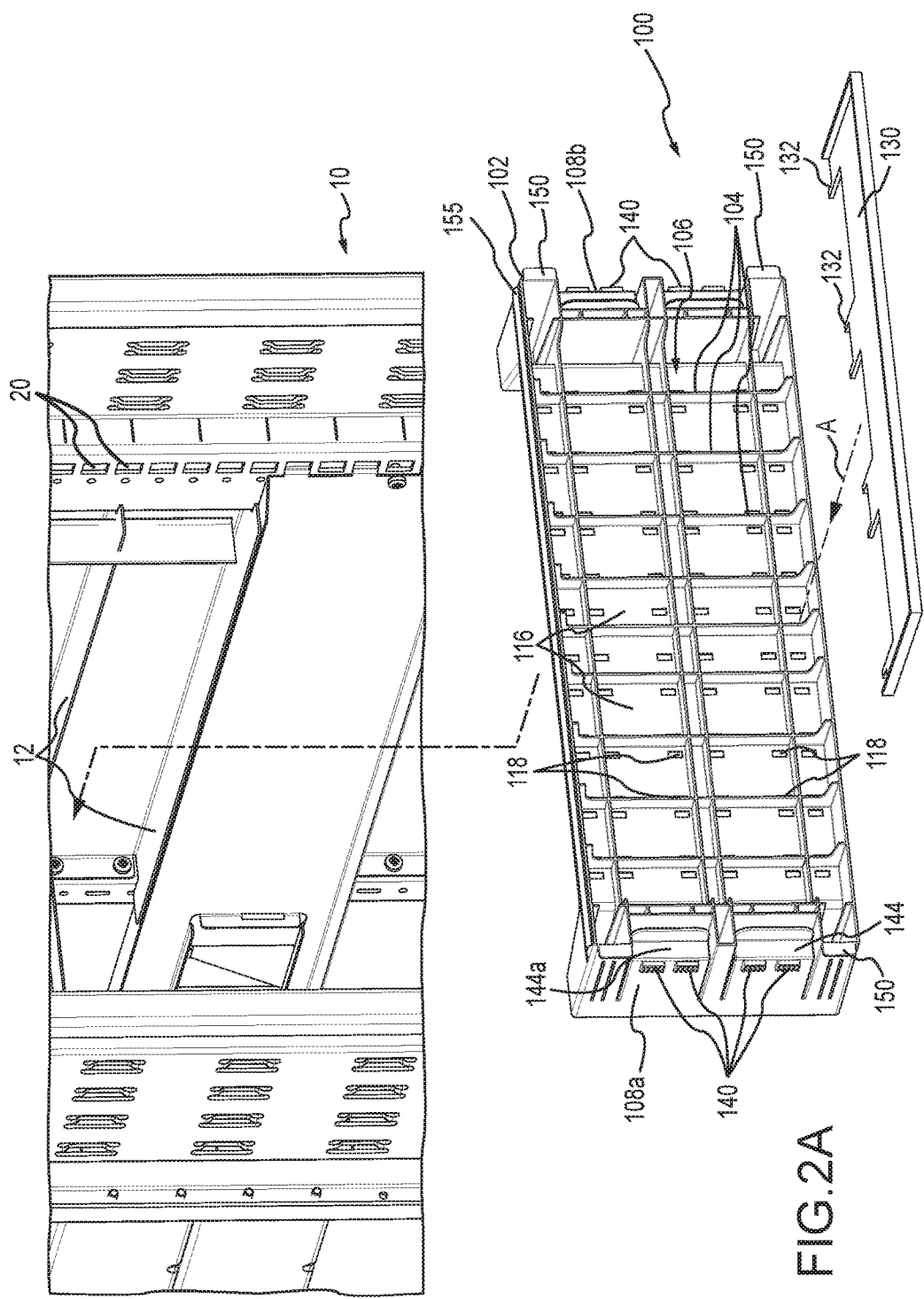

AIR BLOCKING PANEL ASSEMBLIES FOR COMPONENT RACKS

TECHNICAL FIELD

This patent application generally relates to data storage server configurations, and more specifically, to air blocking panel assemblies for component racks.

BACKGROUND

Many servers and other computer systems contain components housed in a component rack. Such an arrangement allows users to easily access, service, and/or replace the components. The components are typically arranged in a stacked configuration within the component rack and cables can be connected to the front sides of the components to provide power and/or communication. The tightly packed component racks, however, may include one or more empty slots that do not contain a component. In some conventional arrangements, a temporary cardboard box can be positioned within the empty slot(s) and used to prevent air flow through the empty slot(s) in the component rack. The conventional boxes, however, don't seal properly against adjacent components and often allow too much airflow leakage between components within the rack. Further, because of the poor fit of the temporary cardboard box within the rack, the boxes often vibrate out of position from the component rack during transport/operation.

BRIEF DESCRIPTION OF THE DRAWINGS

Embodiments of air blocking panel assemblies disclosed herein may be better understood by referring to the following Detailed Description in conjunction with the accompanying drawings, in which like reference numerals indicate identical or functionally similar elements:

FIG. 2A is an enlarged isometric view of the air blocking panel assembly of FIG. 1 before installation with the component rack.

Figure 1:
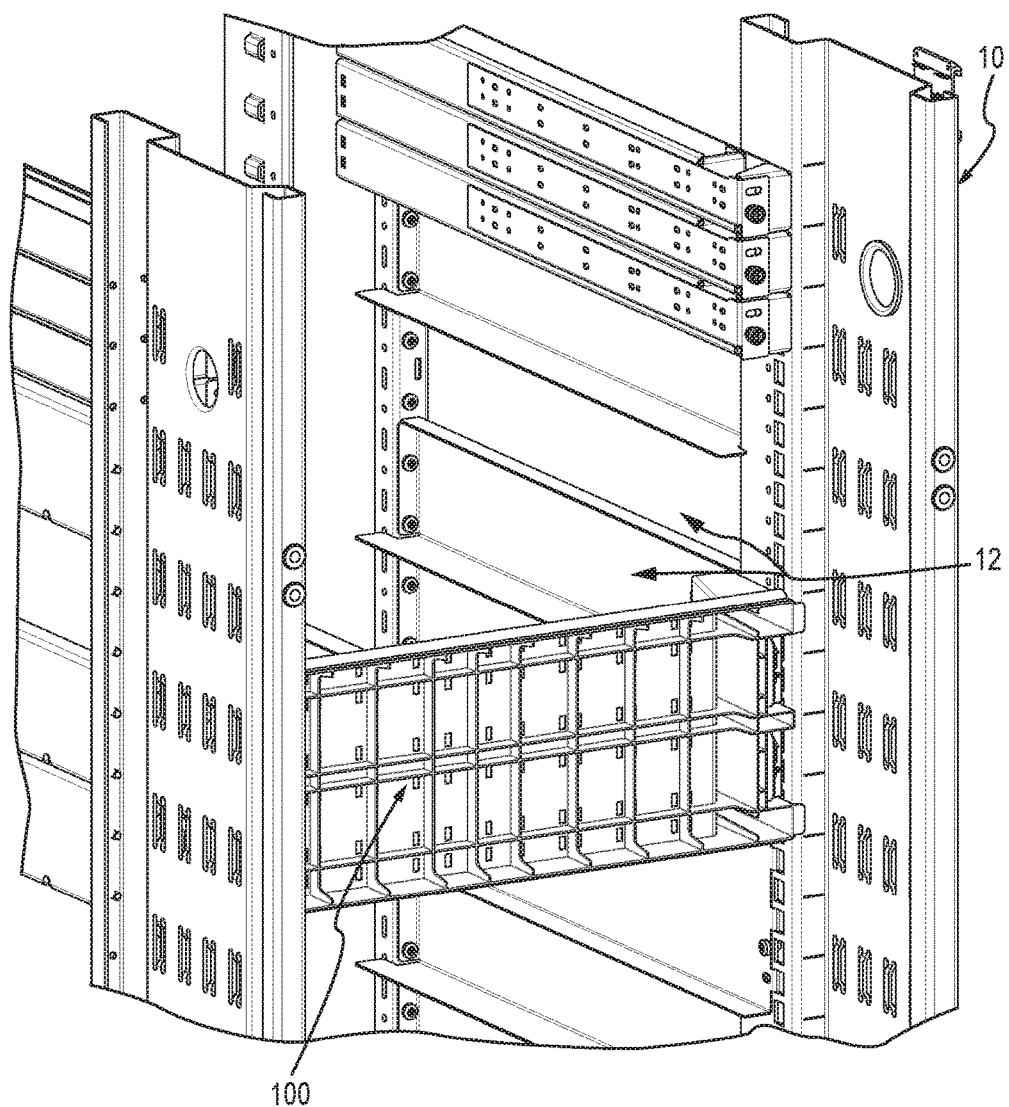
FIG. 1 is an isometric view of an air blocking panel assembly mounted in a component rack according to a representative embodiment of the present technology.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all suitable modifications, equivalents, and alternatives falling within the scope of the embodiments as defined by the appended claims.

DETAILED DESCRIPTION

Overview

The following disclosure describes various embodiments of air blocking panel assemblies mountable within component racks or cabinets. For example, an air blocking assembly configured in accordance with the present technology can include a frame portion and a plurality of first engagement features arranged on opposing end regions of the frame portion. The first engagement features are positioned to releasably mate with corresponding second engagement features of the component rack to retain the air blocking panel assembly within the component rack. The air blocking panel assembly can further include a plurality of removable tooling features arranged across a front side of the frame portion. The removable tooling features comprise selectively removable knockout holes that, when removed, are positioned to receive retention members from an external accessory such as a cable tray. In some embodiments, the first engagement features of the air blocking panel assembly may be integrally formed with the frame portion. Further, the entire air blocking panel assembly may comprise a single, unitary component. The disclosed air blocking panel assemblies are configured for installation and uninstallation with the component rack by hand without the use of any tools.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

FIG. 1 is an isometric view of an air blocking panel assembly 100 mounted in a component rack 10 according to a representative embodiment of the present technology. The rack 10 is, for example, a conventional rack or cabinet adapted to house a number of horizontally oriented components (not shown) in a number of horizontal rack spaces 12. The air blocking panel assembly 100 is adapted to be quickly installed/removed from the component rack 10 and can be positioned between powered equipment (e.g., data storage server equipment, fan trays, power supplies, etc.) installed within the component rack 10. When installed, the air blocking panel assembly 100 is designed to inhibit or block air leakage from a front side of the rack 10 through horizontal rack spaces 12 that do not include powered equipment installed therein.

The air blocking panel assembly 100 is configured to be installed within one or more of the horizontal rack spaces 12. In the illustrated embodiment, for example, the air blocking panel assembly 100 is sized such that it takes up a single available horizontal rack space 12 (i.e., a space that doesn't include other suitable equipment). In other embodiments, however, the air blocking panel assembly 100 may be larger such that it is sized to fit across two or more horizontal rack spaces 12. Further details regarding the air blocking panel assembly 100 and its features are described below with reference to FIGS. 2A-4.

Figure 2B:
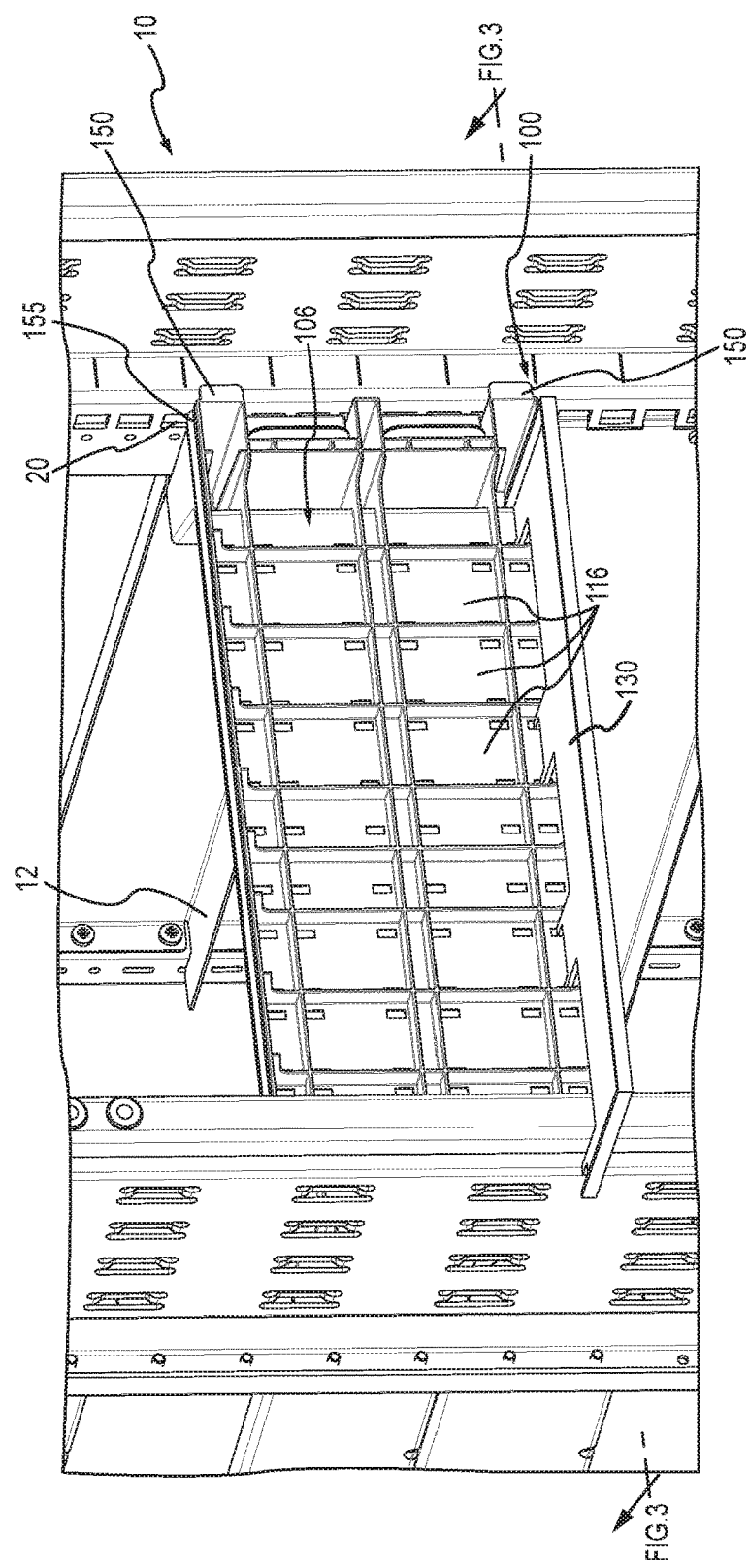
FIG. 2B is an enlarged isometric view of the air blocking panel assembly of FIG. 2A after installation with the component rack.

FIG. 2A, for example, is an enlarged isometric view of the air blocking panel assembly 100 of FIG. 1 before installation with the component rack 10, and FIG. 2B is an enlarged isometric view of the air blocking panel assembly 100 after installation with a selected horizontal race space 12 in the component rack 10. Referring to FIGS. 2A and 2B together, the air blocking panel assembly 100 includes a frame portion 102 and a plurality of ribs 104. The ribs 104 are structural features arranged to provide stiffness to the frame portion 102 and prevent or inhibit undesired bending or warping of the air blocking panel assembly 100 during installation with the component rack 10 and/or during operation of the air blocking panel assemblies within the component rack 10. In the illustrated embodiment, the ribs 104 are integrally formed with the frame portion 102. In other embodiments, the frame portion 102 may include a different number of ribs 104 and/or the ribs 104 may have a different arrangement relative to the frame portion 102.

The frame portion 102 and ribs 104 of the air blocking panel assembly 100 are arranged such that they define a plurality of panels 116 across a front side or face 106 of the assembly 100. The size, shape, and number of panels 116 can vary according to the arrangement of the frame portion 102 and/or ribs 104. As shown, for example, the individual panels 116 are generally rectangular. In other embodiments, however, the panels 116 may have different shapes and/or sizes.

The panels 116 may also include a plurality of component or tool mounting features. More specifically, the panels 116 include one or more "knockout" holes or apertures 118. The knockout holes 118 are small regions or portions of particular panels 116 that can be selectively removed by an operator and the remaining hole/apertures can be used as mounting features for attaching tooling or other accessories to the face 106 of the air blocking panel assembly 100. In the embodiment shown in FIGS. 2A and 2B, the knockout holes 118 are generally rectangular. In other embodiments, however, the knockout holes 118 can have a variety of different shapes (e.g., circular or generally circular, square, triangular, etc.).

In the illustrated embodiment, each panel 116 includes four knockout holes 118 arranged proximate the corners of each respective panel 116. In other embodiments, however, the knockout holes 118 may have a different arrangement relative to each other in each panel 118. Further, in some embodiments certain panels 116 may not include the knockout holes 118.

As noted above, during operation, a number of knockout holes 118 may be selectively removed to allow attachment of a component accessory or tooling to the air blocking panel assembly 100. In the embodiment shown in FIGS. 2A and 2B, for example, a cable tray 130 may be attached to the front side 106 of the air blocking panel assembly 100 (as shown by the arrow A). The cable tray 130 includes retention members 132 configured to be received within the corresponding knockout holes 118 to removably secure the cable tray 130 to the front side 106 of the air blocking panel assembly 100. The cable tray 130 allows for cable bend radius management for one or more powered accessories (not shown) within the component rack 10. This feature is expected to be particularly useful as more and more powered accessories used within the component rack 10 utilize optical cables and other cables with tightly controlled bend radius requirements. Other suitable accessories or tooling may be removably attached to the air blocking panel assemblies 100 in a similar fashion as the cable tray 130. Such accessories may be used in addition to, or in lieu of, the cable tray 130. Suitable accessories can include, for example, cable management fingers to help manage cable loops and service loops from equipment adjacent to the air blocking panel assembly 100, other cable management features or tools, or other features associated with operation or maintenance of the powered accessories within the component rack 10.

One feature of the air blocking panel assembly 100 is that an operator can selectively install and uninstall the assembly 100 from the component rack 10 without tools. For example, as best seen in FIG. 2A, a plurality of first engagement features 140 are arranged along edge or side regions 108a and 108b of the frame portion 102. The first engagement features 140 are positioned to be mated with corresponding second engagement features 20 of the component rack 10 to removably secure the air blocking panel assembly 100 to the component rack 10. As shown, for example, the first engagement features 140 comprise protruding members or stand-offs positioned to engage with and be retained by corresponding second engagement features 20 of the component rack 10 to removably secure the air blocking panel assembly 100 in place. In other embodiments, however, the first engagement features 140 may have a different arrangement and/or include different features. For example, the first engagement features 140 may comprise protruding features, guide pins, or raised features having a different shape, size, and/or arrangement along the side regions 108a and 108b of the frame portion 102 and positioned to engage or mate with corresponding apertures or receiving features of the rack 10 for removably mounting the air blocking panel assembly 100.

Figure 3:
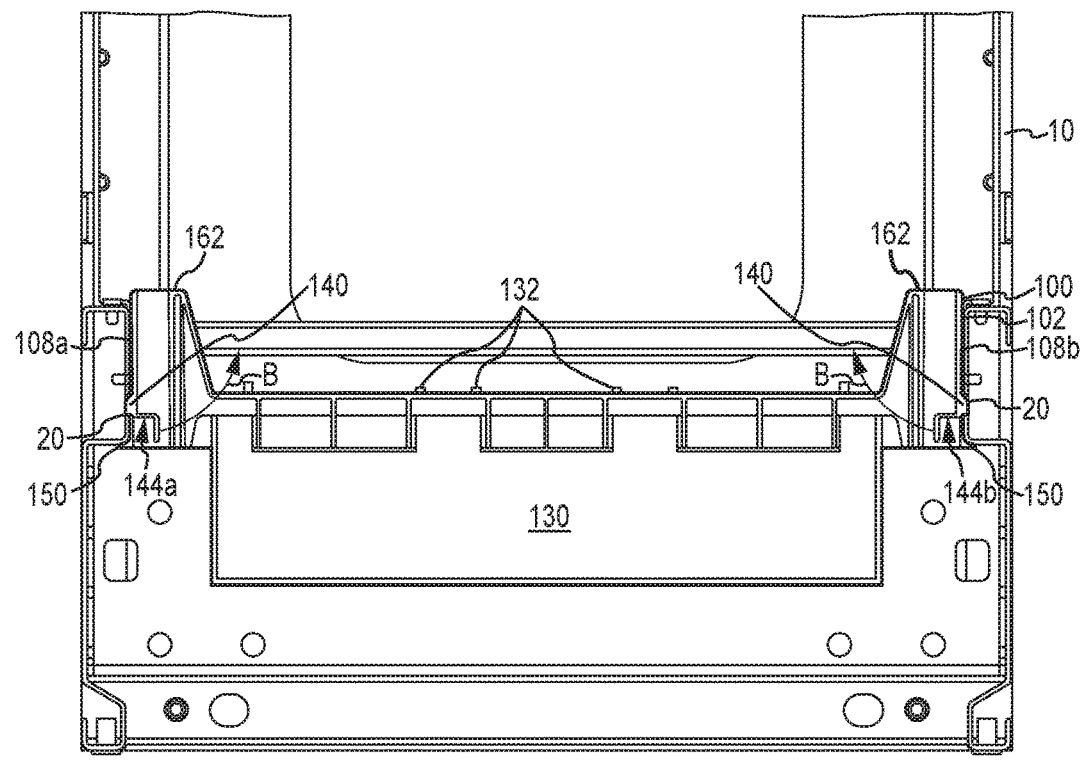
FIG. 3 is a top view of the air blocking panel assembly of FIG. 2B taken along line 3-3.

FIG. 3 is a top view of the air blocking panel assembly 100 of FIG. 2B taken along line 3-3. For purposes of illustration and clarity, the air blocking panel assembly 100 is shown in FIG. 3 with a darker line weight than that of the component rack 10. Referring to FIGS. 2A-3 together, in operation, a user (not shown) aligns the air blocking panel assembly 100 with the desired horizontal rack space 12 and pushes the assembly 100 into the rack 10 until the first engagement features 140 (e.g., protruding members) find the corresponding second engagement features 20 (e.g., rectangular openings) and removably snap into place. As best seen in FIG. 3, the first engagement features 140 are mated with the second engagement features 20 in a press fit or snap fit arrangement. In other embodiments, however, the first engagement features 140 may be mated with the corresponding second engagement features 20 in another suitable fashion.

The air blocking panel assembly 100 further includes a plurality of alignment tabs or flanges 150 arranged along the side regions 108a and 108b of frame portion 102. The alignment tabs 150 are hard stops positioned to engage the component rack 10 and help align the front side or face 106 of the air blocking panel assembly 100 such that it is flush or generally flush with front faces of other components (not shown) within the component rack itself. While two alignment tabs 150 are shown on each side region 108a/108b of the frame portion 102, in other embodiments the air blocking panel assembly 100 may include a different number of alignment tabs 150. Further, it will be appreciated that the alignment tabs 150 are optional components that may not be included in all embodiments.

To remove the air blocking panel assembly 100 from the component rack 10, the user merely has to engage and push against release tabs or features 144. In the illustrated embodiment, the air blocking panel assembly 100 includes a first release tab 144a positioned adjacent one end region 108a and a second release tab 144b positioned adjacent the opposite end region 108b of the frame portion 102. As best seen in FIG. 3, pushing inwardly against the release tabs 144 causes the first engagement features 140 to rotate toward the front side of the air blocking panel assembly 100 (as shown by the arrows B) and out of engagement with the respective second engagement features 20 of the rack 10. When the first engagement features 140 are at least partially withdrawn from the corresponding second engagement features 20, the user can pull the air blocking panel assembly 100 outwardly away from the component rack 10 for removal.

As also best seen in FIG. 3 and as discussed previously, the cable tray 130 includes retention members 132 configured to be received within and extend through corresponding knockout holes 118 (FIG. 2A) to removably secure the cable tray 130 to the front side 106 of the air blocking panel assembly 100 in a press fit arrangement. In the illustrated embodiment, for example, the retention members 132 are generally rectangular and sized such that they mate with the rectangular-shaped knockout holes 118 to removably secure the cable tray 130 in place for operation. As further noted above, additional tooling and/or accessories may be installed with the air blocking panel assembly 100 using the knockout holes 118.

Referring back to FIGS. 2A and 2B, the air blocking panel assembly 100 can further include one or more gaskets or sealing features 155 to further assist with blocking or inhibiting bypass airflow. In the illustrated embodiment, for example, the air blocking panel assembly 100 includes a gasket 155 extending along all or substantially all of an upper edge 107 of the frame portion 102. The gasket 155 is sized and shaped to sealably engage against a neighboring air blocking panel assembly (not shown) or sealably engage against a neighboring component or powered accessory (not shown) within the component rack 10.

The gasket 155 is composed of a suitable compressible material configured to provide adequate sealing against the neighboring component. The gasket 155, for example, may be composed of a polyester material (such as a polyester film sold under the trademark MYLAR), open cell foam material, a closed cell foam material, another suitable foam material, or a combination of materials. In some embodiments, the air blocking panel assembly 100 may include gaskets 155 on both the upper edge 107 and a lower edge 108 of the frame portion 102. In other embodiments, the air blocking panel assembly 100 may not include any gasket(s) or sealing feature(s) 155.

One feature of the air blocking panel assembly 100 in the embodiments illustrated above is that the assembly 100 is a single, unitary component. The air blocking panel assembly 100, for example, may be manufactured as a single component and be formed of the same material throughout. The assembly 100 may be composed of a plastic material, a recycled plastic material, or another suitable material or combination of materials that are suitably rigid and can be manufactured with the integral components of the assembly 100 described herein.

Figure 4:
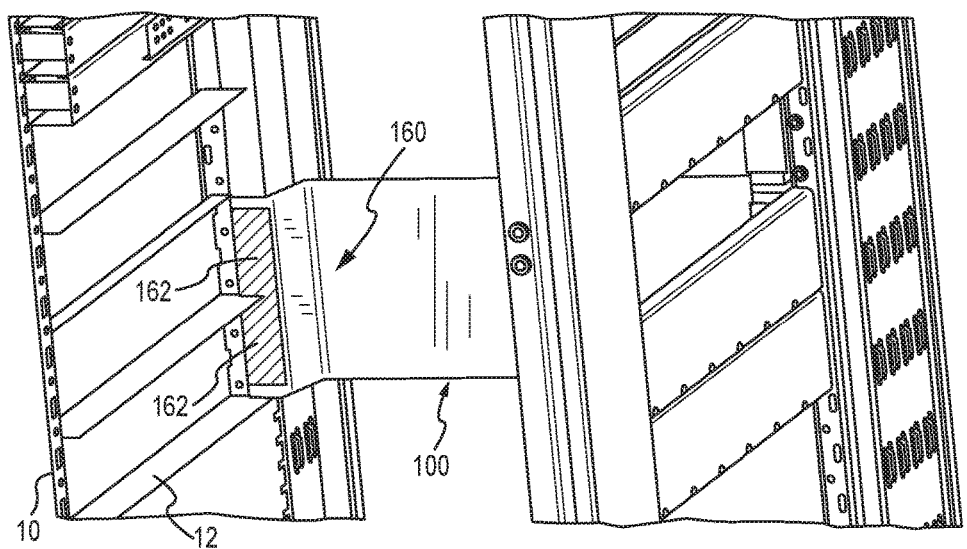
FIG. 4 is an isometric view similar to FIG. 1 as viewed from the opposite side of the component rack.

FIG. 4 is an isometric view similar to FIG. 1 as viewed from the opposite side of the component rack 10. As shown in FIG. 4, the air blocking panel assembly 100 includes a protective film 162 on a back side or rear face 160 of the assembly 100. The protective film 162, for example, can be used to cover regions of the frame portion 102 that receive tooling during the manufacturing process. In one embodiment, for example, the protective film 162 may be used to cover apertures or openings positioned to receive tool(s) during fabrication of the air blocking panel assembly 100 itself. The protective film 162 may be composed of a polyester material (such as a polyester film sold under the trademark MYLAR), a polymer material, or another suitable material or combination of materials. The protective film 162 is an optional component that may not be included in some embodiments.

CONCLUSION

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. An air blocking panel assembly mountable to a component rack, the air blocking panel assembly comprising:
    a frame portion configured to block air from passing through a slot within the component rack when the slot is empty;
    a plurality of first engagement features arranged on opposing end regions of the frame portion, wherein the first engagement features are positioned to releasably mate with corresponding second engagement features of the component rack; and
    a plurality of selectively removable tooling features arranged across a front side of the frame portion, wherein the selectively removable tooling features comprise selectively removable portions of the frame portion that, when removed, leave remaining knockout holes that are configured to receive retention members from an external accessory.

2. The air blocking panel assembly of claim 1, wherein the frame portion comprises a row of substantially uniform panels.

3. The air blocking panel assembly of claim 1, wherein each of the substantially uniform panels comprises a plurality of the selectively removable portions of the frame portion.

4. The air blocking panel assembly of claim 3, wherein the plurality of the selectively removable portions of the frame portion, within each respective panel, are positioned adjacent a respective corner of the respective panel.

5. The air blocking panel assembly of claim 1, wherein the external accessory comprises a cable tray that comprises a plurality of retention members configured to mate with corresponding knockout holes of the frame portion to removably mount the cable tray to a front face of the air blocking panel assembly.

6. The air blocking panel assembly of claim 5, wherein:
the air blocking panel assembly is configured to block air by standing vertically; and
the cable tray lays substantially flat at a perpendicular angle extending away from the air blocking panel assembly when the plurality of retention members are mated with the corresponding knockout holes of the frame portion.

7. The air blocking panel assembly of claim 6, wherein the plurality of retention members are mated with the corresponding knockout holes of the frame portion along a horizontal row.

8. The air blocking panel assembly of claim 6, wherein:
the frame portion comprises a plurality of panels; and
the plurality of retention members are mated with the corresponding knockout holes of the frame portion across multiple ones of the plurality of panels.

9. The air blocking panel assembly of claim 1, further comprising a gasket extending along an upper edge and/or a lower edge of the frame portion, and wherein, when the air blocking panel assembly is mounted in the component rack, the gasket is positioned to sealably engage against a neighboring component or powered accessory within the component rack.

10. The air blocking panel assembly of claim 9, wherein the gasket is composed of one of a compressible foam material and polyester film.

11. The air blocking panel assembly of claim 1, further comprising one or more alignment tabs carried by and extending from opposing end regions of the frame portion, wherein, when the air blocking panel assembly is mounted to the component rack, the one or more alignment tabs are positioned to directly engage the component rack and position the front side of the frame portion flush or generally flush against a surface of the component rack.

12. The air blocking panel assembly of claim 11, wherein:
the air blocking panel assembly includes two alignment tabs carried by and extending from each of the opposing end regions; and
the alignment tabs at each end region are arranged to selectively align the front side of the frame portion such that, when the air blocking panel assembly is mounted to the component rack, the front side of the frame portion is flush or generally flush with a component surface of adjacent components installed with the component rack.

13. The air blocking panel assembly of claim 1, further comprising a protective film covering at least a portion of a back side of the frame portion.

14. The air blocking panel assembly of claim 1, further comprising release tabs proximate the first engagement features at opposing end regions of the frame portion, and wherein, when the air blocking panel assembly is mounted with the component rack, depressing the release tabs enables the corresponding first engagement features to rotate inwardly toward each other and release the air blocking panel assembly from the component rack.

15. A computer system, comprising:
a cabinet that comprises a component rack and that includes one or more horizontal rack spaces configured to receive server components; and
an air blocking panel assembly mountable within one of the horizontal rack spaces, wherein the air blocking panel assembly is sized and shaped to block air flow through the corresponding horizontal rack space when the corresponding horizontal rack space is empty, and
wherein the air blocking panel assembly includes
a frame portion including a plurality of integrally formed ribs;
a plurality of stand-offs arranged on opposing side regions of the frame portion, wherein the stand-offs are positioned to releasably mate with corresponding apertures of the component rack; and
a plurality of selectively removable tooling features arranged across a face of the frame portion, wherein the selectively removable tooling features comprise selectively removable portions of the frame portion that, when selectively removed, leave remaining knockout holes that are configured to receive retention features from an external accessory.

16. The computer system of claim 15, wherein the stand-offs are integrally formed with the frame portion.

17. The computer system of claim 15, wherein the air blocking panel assembly is a single, unitary component composed of the same material.

18. The computer system of claim 15, wherein the air blocking panel assembly is mountable within and removable from a selected horizontal rack space without the use of any tools.

19. The computer system of claim 15, wherein the frame portion includes a top edge extending between the opposing side regions, and wherein the air blocking panel assembly further comprises an insulating strip extending along the top edge.

20. The computer system of claim 15, further comprising a cable tray, wherein the cable tray comprises a plurality of retention members configured to mate with corresponding knockout regions to removably mount the cable tray to a front face of the air blocking panel assembly.

* * * * *